United States Patent
Son et al.

(10) Patent No.: US 8,519,412 B2
(45) Date of Patent: Aug. 27, 2013

(54) SEMICONDUCTOR LIGHT-EMITTING DEVICE AND METHOD FOR MANUFACTURING THEREOF

(75) Inventors: Su Hyoung Son, Hwaseong-si (KR); Kyoung Jin Kim, Daegu (KR); Eun Mi Ko, Yangju-si (KR); Ung Lee, Ulsan (KR)

(73) Assignee: LG Display Co., Ltd., Seoul (KR)

( * ) Notice: Subject to any disclaimer, the term of this patent is extended or adjusted under 35 U.S.C. 154(b) by 181 days.

(21) Appl. No.: 12/837,274

(22) Filed: Jul. 15, 2010

(65) Prior Publication Data

US 2011/0140127 A1    Jun. 16, 2011

(30) Foreign Application Priority Data

Dec. 11, 2009  (KR) .................. 10-2009-0122914

(51) Int. Cl.
*H01L 33/00*   (2010.01)

(52) U.S. Cl.
USPC ........ 257/79; 257/99; 257/623; 257/E33.005; 438/39; 438/42

(58) Field of Classification Search
USPC ...... 257/79, 99, 622, 623, E33.005, E33.006; 438/22, 39, 42
See application file for complete search history.

(56) References Cited

U.S. PATENT DOCUMENTS

| | | | |
|---|---|---|---|
| 7,683,386 B2 * | 3/2010 | Tanaka et al. .......... | 257/88 |
| 7,985,972 B2 * | 7/2011 | Kim et al. ............. | 257/79 |
| 2009/0045435 A1 | 2/2009 | Yao et al. | |

FOREIGN PATENT DOCUMENTS

| | | |
|---|---|---|
| JP | 2006-332714 | 12/2006 |
| KR | 1020060065869 A | 6/2006 |
| KR | 1020080093222 A | 10/2008 |
| KR | 100882240 B1 | 1/2009 |
| TW | 200906712 A | 2/2009 |

OTHER PUBLICATIONS

Office Action issued in corresponding Korean Patent Application No. 10-2009-0122914, mailed Oct. 5, 2012.
Office Action issued in corresponding Taiwan Patent Application No. 099113954, mailed Apr. 29, 2013, 11 pages.

* cited by examiner

*Primary Examiner* — Tuan N. Quach
(74) *Attorney, Agent, or Firm* — Brinks Hofer Gilson & Lione

(57) ABSTRACT

A semiconductor light-emitting device and a method for manufacturing the same is disclosed, which improves light extraction efficiency by forming a plurality of protrusions on a surface of a substrate for growing a nitride semiconductor material thereon, the semiconductor light-emitting device comprising a substrate; one or more first protrusions on the substrate, each first protrusion having a recess through which a surface of the substrate is exposed planarly; a first semiconductor layer on the substrate including the first protrusions; an active layer on the first semiconductor layer; a second semiconductor layer on the active layer; a first electrode on a predetermined portion of the first semiconductor layer, wherein the active layer and second semiconductor layer are not formed on the predetermined portion of the first semiconductor layer; and a second electrode on the second semiconductor layer.

19 Claims, 14 Drawing Sheets

FIG.8A

| | Power (Watt) | Power (Lumen) |
|---|---|---|
| Power emitted by the sources (MQW) (1) | 0.00147156 Watt | 1 Lumen |
| Generated Power | 0.00147156 Watt | 1 Lumen |
| Power absorbed in the system(Chip) | 0.00108582 Watt | 0.737867 Lumen |
| Power outside the system (2) | 0.000385745 Watt | 0.262133 Lumen |

LIGHT EXTRACTION EFFICIENCY =26%

FIG.8B

| | Power (Watt) | Power (Lumen) |
|---|---|---|
| Power emitted by the sources (MQW) (1) | 0.00147156 Watt | 1 Lumen |
| Generated Power | 0.00147156 Watt | 1 Lumen |
| Power absorbed in the system(Chip) | 0.000460758 Watt | 0.313109 Lumen |
| Power outside the system (2) | 0.0010108 Watt | 0.686891 Lumen |

LIGHT EXTRACTION EFFICIENCY =69%

SEMICONDUCTOR LIGHT-EMITTING DEVICE AND METHOD FOR MANUFACTURING THEREOF

CROSS REFERENCE TO RELATED APPLICATIONS

This application claims the benefit of the Korean Patent Application No. 10-2009-0122914 filed on Dec. 11, 2009, which is hereby incorporated by reference as if fully set forth herein.

BACKGROUND

1. Field of the Disclosure

The present disclosure relates to a semiconductor device, and more particularly, a nitride semiconductor light-emitting device.

2. Discussion of the Related Art

A nitride semiconductor light-emitting device includes ultraviolet, blue, and green light-emitting regions. Specifically, a GaN-based nitride semiconductor light-emitting device can be applied to an optical device of red/green light-emitting diode (LED), and an electronic device corresponding a high-speed switching or high-power device of MESFET (Metal Semiconductor Field Effect Transistor) or HEMT (Hetero Junction Field-Effect Transistor).

FIG. 1 is a cross section view illustrating a nitride semiconductor light-emitting device according to the related art.

As shown in FIG. 1, the nitride semiconductor light-emitting device according to the related art includes a substrate 110, a buffer layer 120, an undoped semiconductor layer 130, an N-type nitride semiconductor layer 140, an active layer 150, a P-type nitride semiconductor layer 160, a transparent electrode layer 170, a P-type electrode on the transparent electrode layer 170, and an N-type electrode 190 on the N-type nitride semiconductor layer 140 exposed by etching the active layer 150 and a predetermined portion of the P-type nitride semiconductor layer 160.

As a voltage is applied to the P-type electrode 180 and N-type electrode 190 in the semiconductor light-emitting device 100, a forward bias is applied between the P-type nitride semiconductor layer 160 and N-type nitride semiconductor layer 140, whereby electrons and holes are recombined in the active layer 150, to thereby emit light.

An important issue in the nitride semiconductor light-emitting device is how effectively the light generated in the active layer 150 is extracted to the external. In case of the nitride semiconductor light-emitting device according to the related art, as shown in FIG. 2A, a refractive index of a composing material of the nitride semiconductor light-emitting device is larger than a refractive index of an ambient material (for example, air, resin, substrate, and etc.) in the vicinity of the nitride semiconductor light-emitting device. Thus, photons generated inside the nitride semiconductor light-emitting device are totally reflected, and are then re-absorbed into the inside of the nitride semiconductor light-emitting device without escaping from the nitride semiconductor light-emitting device, thereby lowering light extraction efficiency.

In order to overcome this problem, there has been proposed a method for forming a stacking-structure wall with a predetermined angle in the semiconductor light-emitting device according to the related art, to thereby extract some of the transverse light generated in the active layer 150. However, this method causes the complicated manufacturing process of the semiconductor light-emitting device, and the increase of manufacturing cost.

In addition, the semiconductor light-emitting device according to the related art is problematic in that a dislocation density of nitride-based semiconductor layer grown on the substrate is raised due to a stress caused by a difference of lattice constant between the substrate and the nitride-based semiconductor layer grown on the substrate.

SUMMARY

A semiconductor light-emitting device comprises a substrate; one or more first protrusions on the substrate, each first protrusion having a recess through which a surface of the substrate is exposed planarly; a first semiconductor layer on the substrate including the first protrusions; an active layer on the first semiconductor layer; a second semiconductor layer on the active layer; a first electrode on a predetermined portion of the first semiconductor layer, wherein the active layer and second semiconductor layer are not formed on the predetermined portion of the first semiconductor layer; and a second electrode on the second semiconductor layer.

In another aspect, there is provided a method for manufacturing a semiconductor light-emitting device comprising forming one or more first protrusions on a substrate, each first protrusion having a recess through which a surface of the substrate is exposed planarly; forming a first semiconductor layer on the substrate including the first protrusions; forming an active layer on the first semiconductor layer; forming a second semiconductor layer on the active layer; etching predetermined portions of the active layer and second semiconductor layer until the first semiconductor layer is exposed; and forming a first electrode on a predetermined portion of the first semiconductor layer, wherein the active layer and second semiconductor layer are not formed on the predetermined portion of the first semiconductor layer, and forming a second electrode on the second semiconductor layer.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings:

FIGS. 8A and 8B are a table showing improvement of light extraction efficiency in a semiconductor light-emitting device according to the first embodiment of the present invention by comparing light extraction efficiency in a related art semiconductor light-emitting device with light extraction efficiency in the semiconductor light-emitting device according to the first embodiment of the present invention;

DETAILED DESCRIPTION OF THE EXEMPLARY EMBODIMENTS

Reference will now be made in detail to the exemplary embodiments of the present invention, examples of which are illustrated in the accompanying drawings. Wherever possible, the same reference numbers will be used throughout the drawings to refer to the same or like parts.

Hereinafter, a semiconductor light-emitting device according to the present invention and a method for manufacturing the same will be described with reference to the accompanying drawings.

First Embodiment

Figure 1:
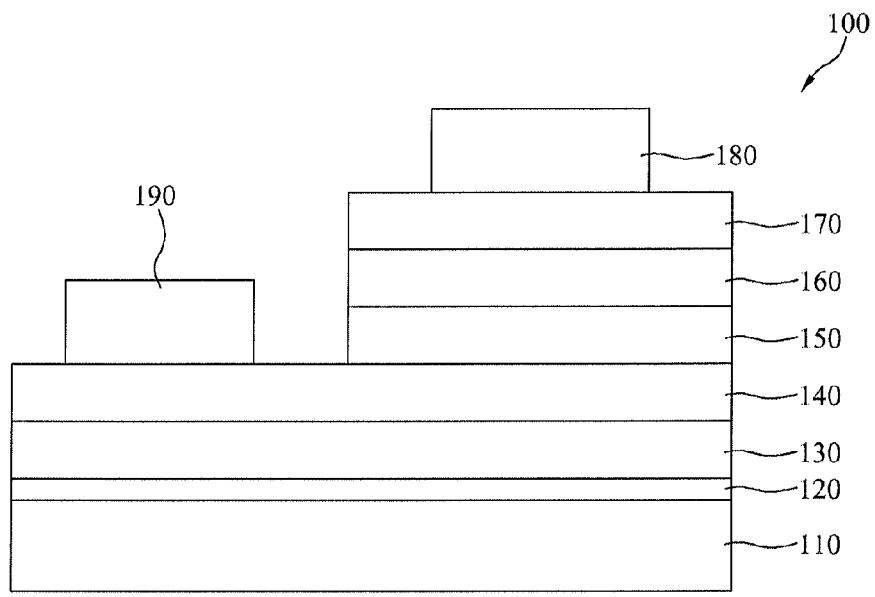
FIG. 1 is a cross section view illustrating a structure of a semiconductor light-emitting device according to the related art.
Figure 2A:
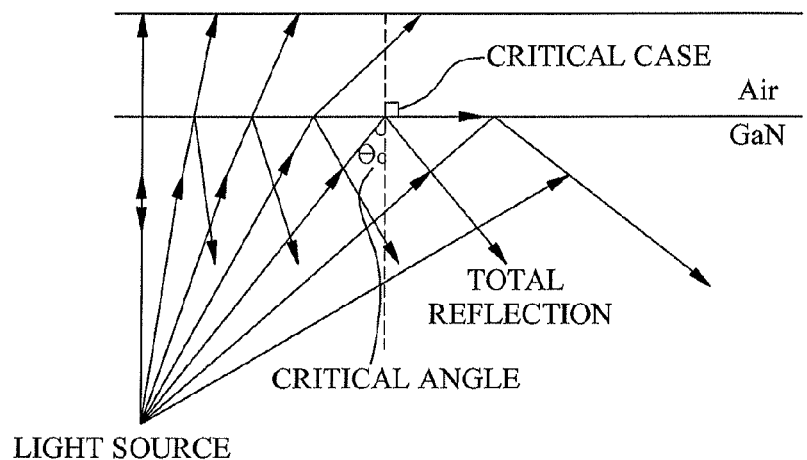
FIG. 2A illustrates totally-reflected light in a semiconductor light-emitting device according to the related art.
Figure 2B:
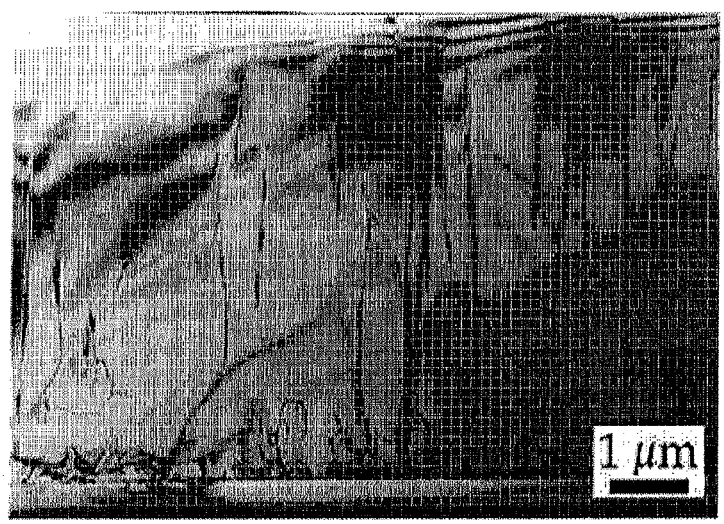
FIG. 2B illustrates a dislocation generated in a semiconductor light-emitting device according to the related art.
Figure 3A:
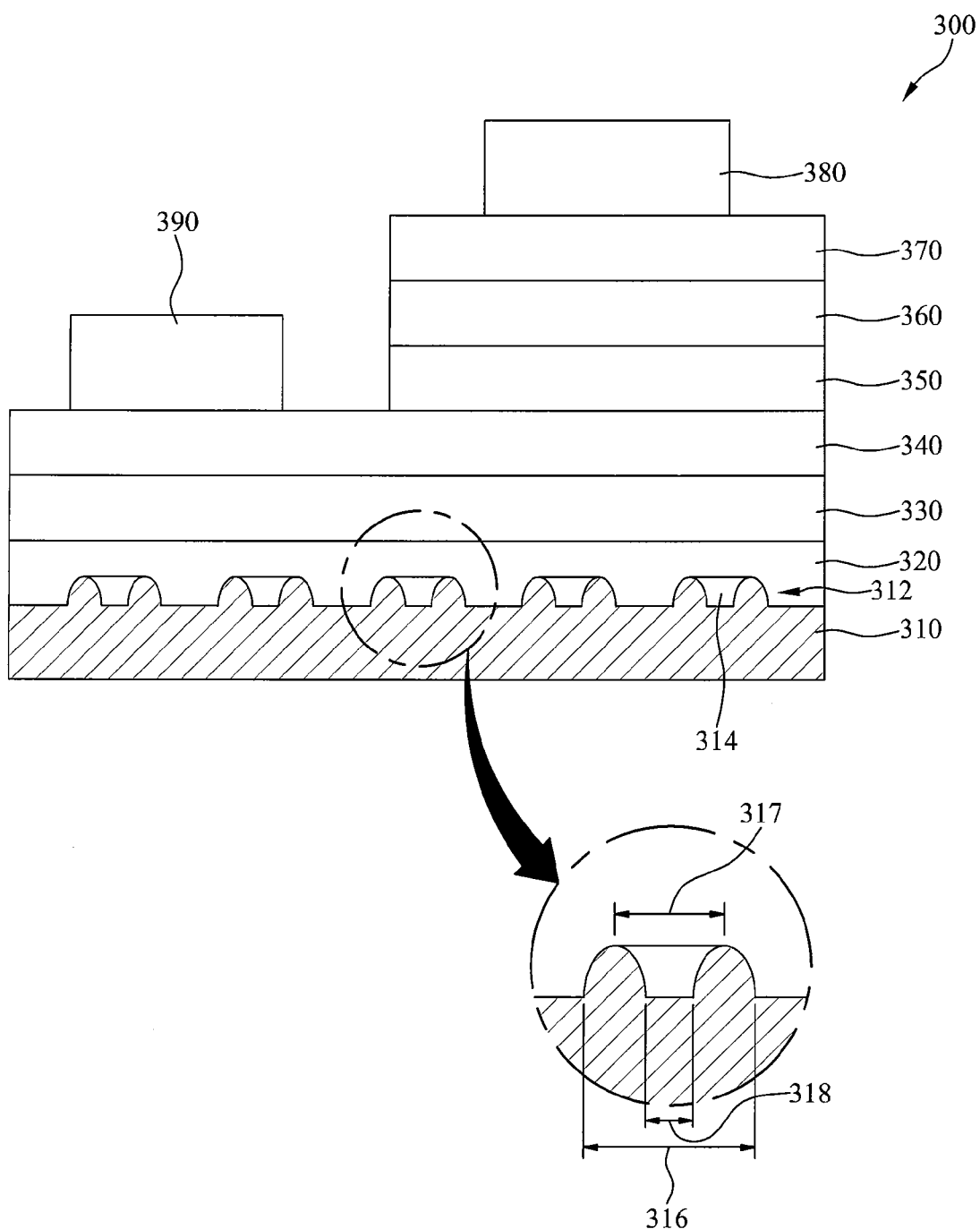
FIG. 3A is a cross section view illustrating a semiconductor light-emitting device according to the first embodiment of the present invention.

FIG. 3A illustrates a structure of a semiconductor light-emitting device according to the first embodiment of the present invention. As shown in FIG. 3A, the semiconductor light-emitting device according to the first embodiment of the present invention includes a substrate 310 on which one or more protrusions are formed, a buffer layer 320, an undoped semiconductor layer 330, an N-type nitride semiconductor layer 340, an active layer 350, a P-type nitride semiconductor layer 360, a transparent electrode layer 370, a P-type electrode 380, and an N-type electrode 390.

Since there is no commercially available substrate which has the same crystal structure as crystals of nitride semiconductor material growing thereon while exhibiting a lattice matching, a sapphire substrate is primarily used for the substrate 310, in consideration of the lattice matching.

The sapphire substrate is a crystal body having Hexa-Rhombo R3c symmetry, which has the characteristics such as 13.001 Å lattice constant in the c-axis direction; 4.765 Å distance between lattices in the a-axis direction; and C(0001) plane, A(1120) plane, and R(1102) plane in the direction of the orientation plane of the sapphire. On the C plane of the sapphire substrate, the nitride semiconductor material is easily grown, and is also stable at a high temperature. In this respect, the sapphire substrate is primarily used as the substrate for blue or green light-emitting device.

For improving light extraction efficiency and quality of the nitride semiconductor material growing on the substrate 310, one or more protrusions 312 are formed on the substrate 310 of the semiconductor light-emitting device 100 according to the first embodiment of the present invention, as shown in FIG. 3A. In this case, the protrusions 312 may be formed by etching the substrate 310.

According to one embodiment of the present invention, a recess 314 is formed in each protrusion 312, so that the surface of the substrate 310 can be exposed through the recess 314 of the protrusion 312. This is for increasing the surface area of the substrate 310 on which the semiconductor material grows. That is, the semiconductor material is capable of being grown on the surface of the substrate 310 in the recess 314 of the protrusion 312, thereby resulting in the increased surface area of the substrate 310 on which the semiconductor material can be grown.

Figure 4A:
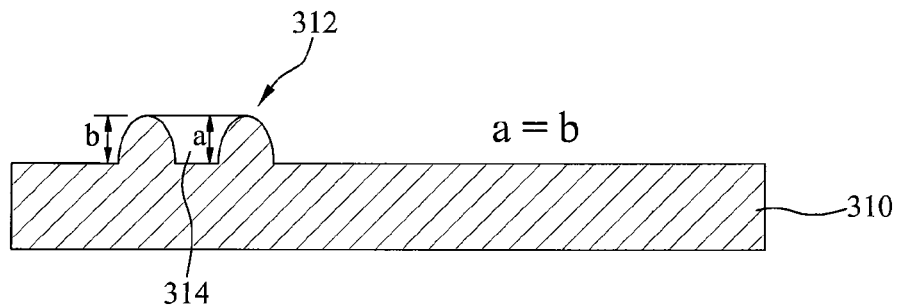
FIGS. 4A to 4C are cross section views illustrating various depths of recess in each protrusion.

As shown in FIG. 4A, the recess 314 is formed in the protrusion 312, wherein the surface of the substrate 310 exposed through the recess 314 is planar and has the directional property of the c(0001) plane. That is, the planar bottom surface of the recess 314 enables the semiconductor material to grow planarly on the surface of the substrate 310 in the protrusion 312. As a result, it is possible to improve quality of the semiconductor layer grown on the surface 310, and also to lower a dislocation density of the semiconductor layer.

Figure 4B:
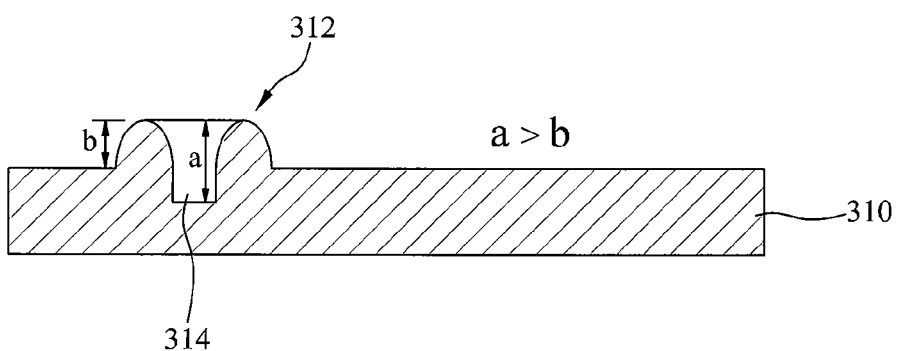

As shown in FIG. 4A, a depth (a) of the recess 314 inside the protrusion 312 may be the same as a height (b) of the protrusion 312. However, a modified embodiment of the present invention discloses that a depth (a) of the recess 314 is larger than a height (b) of the protrusion 312, as shown in FIG. 4B. According as the depth (a) of the recess 314 is larger than the height (b) of the protrusion 312 (that is, a>b), the bottom surface of the recess 314 is lower than the upper surface of the substrate 310, thereby resulting in the improved light extraction efficiency owing to the increase of angle and area for totally reflecting the light.

Figure 4C:
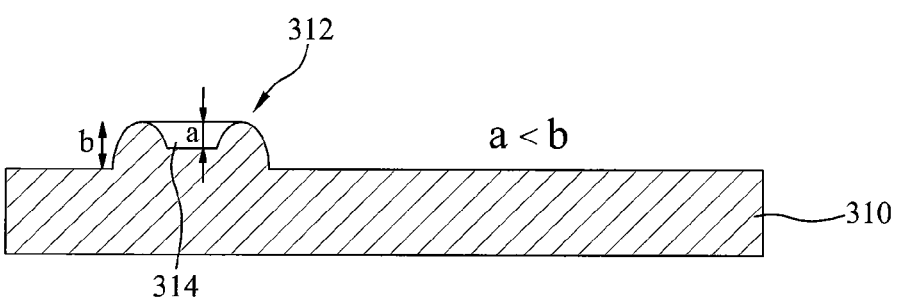

Another modified embodiment of the present invention discloses that a depth (a) of the recess 314 is smaller than a height (b) of the protrusion 312 (that is, a<b), as shown in FIG. 4C. In this case, the inner bottom surface of the protrusion 312 will be exposed through the recess 314. Preferably, the inner bottom surface of the protrusion 312 exposed through the recess 314 is planar and has the directional property of the c(0001) plane.

When forming the protrusion 312 according to the aforementioned embodiments of the present invention, an area of the protrusion 312 in a horizontally-sectioned view is gradually decreased from its bottom 316 to top 317, wherein the bottom of the protrusion 312 is in contact with the substrate 310. Meanwhile, the recess 314 inside the protrusion 312 is formed in such a way that an area of the recess 314 in a horizontally-sectioned view is gradually increased from its bottom 318 to top 317, wherein the bottom of the recess 314 is positioned near to the upper surface of the substrate 310.

Figure 5A:
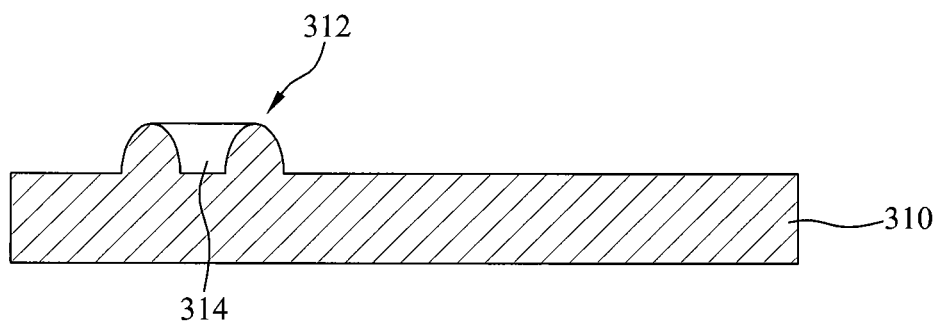
FIGS. 5A and 5B are cross section views illustrating various shapes of protrusion.
Figure 5B:
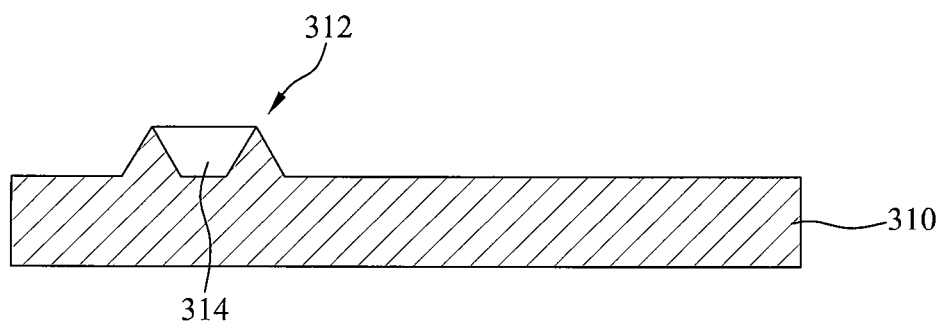

For example, the protrusion 312 may be formed in such a way that its one vertical cross section is a semicircle shape, as shown in FIG. 5A; or the protrusion 312 may be formed in such a way that its one vertical cross section is a polygonal shape such as triangle, as shown in FIG. 5B.

Figure 3B:
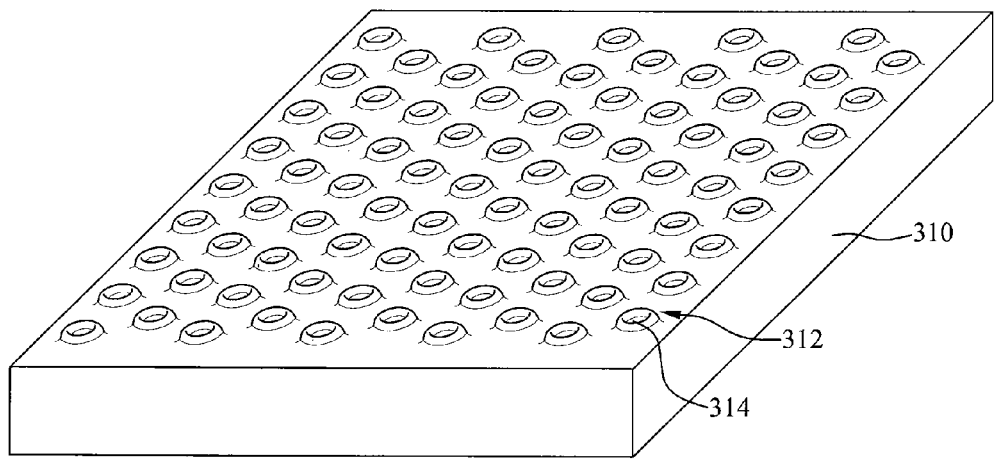
FIG. 3B is a perspective view illustrating a substrate on which protrusions are formed according to the first embodiment of the present invention.

FIG. 3B shows an example of the aforementioned protrusion 312 on the substrate 310. As shown in FIG. 3B, it is known that the protrusion 312 is provided with the recess 314 which enables to expose the surface of the substrate 310 therethrough. At this time, the plurality of protrusions 312 may be arranged regularly or irregularly on the substrate 310.

FIG. 3B illustrates the ring-shaped protrusion 312 with the recess 314 therein. However, the shape of protrusion 312 is not limited to the aforementioned ring shape. For example, the protrusion 312 may be formed in a polygonal ring shape such as a triangular or rectangular ring shape.

The aforementioned embodiment of the present invention discloses that the sapphire substrate is used as the substrate 310. Selectively, the substrate 310 may be formed of GaN, SiC, ZnO, GaP, GaAs, or a conductive material.

Referring once again to FIG. 3A, the buffer layer 320 is provided to decrease a difference of the lattice constant between the substrate 310 and the N-type nitride semiconductor layer 340. The buffer layer 320 is formed on the substrate 310 including the protrusions 312. The buffer layer 320 may be selectively formed in AlInN structure, InGaN/GaN super lattice structure, InGaN/GaN stacking structure, or AlInGaN/InGaN/GaN stacking structure.

The undoped semiconductor layer 330 is formed on the buffer layer 320, wherein the undoped semiconductor layer 330 may be formed of a GaN-based material. For example, the undoped semiconductor layer 330 may be formed on the buffer layer 320 by supplying $NH_3$ and tri-metal gallium (TMGa) at a temperature of 1500° C.

The aforementioned embodiment of the present invention includes both the buffer layer 320 and undoped semiconductor layer 330. However, a modified embodiment of the present invention may include any one of the buffer layer 320 and undoped semiconductor layer 330, or may include neither the buffer layer 320 nor undoped semiconductor layer 330.

The N-type nitride semiconductor layer 340 is formed on the undoped semiconductor layer 330. Typically, the N-type nitride semiconductor layer 340 is formed of GaN, AlGaN, InGaN, AlN, or AlInGaN. In this case, a dopant used for forming the N-type nitride semiconductor layer 340 may be Si, Ge, Sn, Se, or Te.

The N-type nitride semiconductor layer 340 may be formed by growing the aforementioned semiconductor material on the substrate 310 by MOCVD (Metal Organic Chemical Vapor Deposition), MBE (Molecular Beam Epitaxy), or HYPE (Hydride Vapor Phase Epitaxy).

The active layer 350 is provided to emit the light, which is obtained by forming a multiple quantum well (MQW) under such circumstances that a well is formed of InGaN layer, and a barrier layer is formed of (Al)GaN layer. A blue light-emitting diode uses a multiple quantum well structure of InGaN/GaN; and an ultraviolet light-emitting diode uses a multiple quantum well structure of GaN/AlGaN, InAlGaN/InAlGaN, or InGaN/AlGaN. On improvement of efficiency in the active layer 350, a light wavelength can be controlled by changing a component of In or Al; or an internal quantum efficiency can be improved by changing a depth of the well in the active layer 350, the number of active layer 350, and the thickness of active layer 350.

The active layer 350 may be formed on the N-type nitride semiconductor layer 340 by MOCVD (Metal Organic Chemical Vapor Deposition), MBE (Molecular Beam Epitaxy), or HVPE (Hydride Vapor Phase Epitaxy).

The P-type nitride semiconductor layer 360 is formed on the active layer 350, wherein the P-type nitride semiconductor layer 360 may be formed of a typical nitride-based semiconductor material such as GaN, AlGaN, InGaN, AlN, or AlInGaN. In this case, a dopant used for forming the P-type semiconductor layer 360 may be Mg, Zn, or Be.

The P-type nitride semiconductor layer 360 may be formed by growing the aforementioned nitride-based semiconductor material on the active layer 350 by MOCVD (Metal Organic Chemical Vapor Deposition), MBE (Molecular Beam Epitaxy), or HVPE (Hydride Vapor Phase Epitaxy).

The transparent electrode layer 370 is formed on the P-type nitride semiconductor layer 360. Preferably, the transparent electrode layer 370 is formed of a material which is capable of reducing a contact resistance to the P-type nitride semiconductor layer 360 having a relatively-high energy band gap, and also having good light-transmitting property so as to upwardly transmit the light generated in the active layer 350 therethrough.

Generally, the transparent electrode layer 370 is formed in a dual-layered structure of Ni/Au. Preferably, the transparent electrode layer 370 is formed of a predetermined material such as Indium-Tin-Oxide (ITO), Cadmium-Tin-Oxide (CTO), or Titanium-Tungsten-Nitride (TiWN). The aforementioned predetermined material for the transparent electrode layer 370 can realize good light-transmitting property, but its contact resistance is relatively high.

The transparent electrode layer 370 may be formed by a deposition method such as MOCVD (Metal Organic Chemical Vapor Deposition) or MBE (Molecular Beam Epitaxy); or may be formed by sputtering. At this time, a heat treatment of about 400° C. to 900° C. is applied to improve ohmic contact property.

The P-type electrode 380 is formed on the transparent electrode layer 370. The P-type electrode 380 may be generally formed of aurum (Ar) or an alloy containing aurum (Au) by a deposition method such as MOCVD (Metal Organic Chemical Vapor Deposition) or MBE (Molecular Beam Epitaxy), or by sputtering.

The N-type electrode 390 is formed on the mesa-etched N-type nitride semiconductor layer 340, wherein the N-type electrode 290 may be formed in a single-layered structure or multi-layered structure using a material selected from a material group of Ti, Cr, Al, Cu, and Au. The N-type electrode 390 may be formed on the N-type nitride semiconductor layer 340 by a deposition method such as MOCVD (Metal Organic Chemical Vapor Deposition) or MBE (Molecular Beam Epitaxy), or by sputtering.

A method for manufacturing the light-emitting device according to the first embodiment of the present invention will be described with reference to FIG. 6. FIGS. 6A to 6E are cross section views illustrating a method for manufacturing the semiconductor light-emitting device according to the first embodiment of the present invention.

Figure 6A:
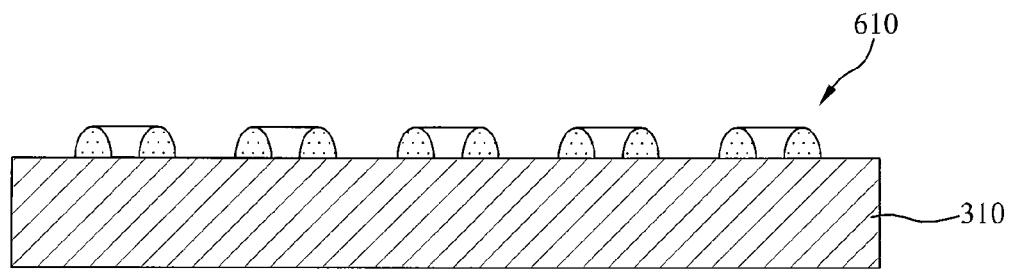
FIGS. 6A to 6E are cross section views illustrating a method for manufacturing a semiconductor light-emitting device according to the first embodiment of the present invention.

Referring to FIG. 6A, a mask pattern 610 is formed on the substrate 310, wherein the mask pattern 610 is formed of photoresist, polymer, oxide layer ($SiO_2$), nitride layer ($SiN_x$), or metal thin film. The mask pattern 610 is provided to form the protrusion 312 with the recess 314 therein.

A process for forming the mask pattern 610 through the use of photoresist will be explained in brief First, after coating the substrate 310 with the photoresist, the photoresist is exposed and developed through the use of mask for formation of the pattern, to thereby form the desired mask pattern 610 on the substrate 310.

Figure 6B:
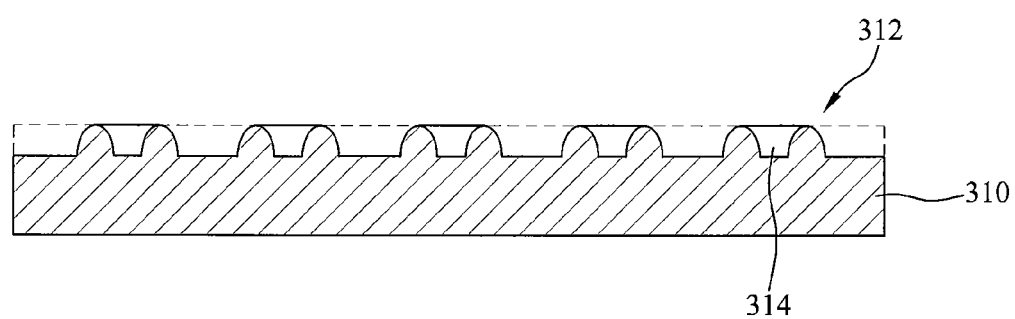

After that, as shown in FIG. 6B, after etching the substrate 310 on which the mask pattern 610 is formed, the mask pattern 610 is removed from the substrate 310, thereby forming one or more protrusions 312, wherein each protrusion 312 is provided with the recess 314 therein. According to one embodiment of the present invention, the substrate 310 may be etched by wet etching or plasma etching. If applying the wet etching, the substrate 310 may be etched by using Cl-based gas selected from a group including $Cl_2$, $BCl_3$, HCl, and $CCl_4$, or by using an acid selected from a group including HBr, HF, HI, $H_2SO_4$, $NHO_3$, and $H_3PO_4$.

According to the present invention, the protrusion 312 with the recess 314 provided therein is formed on the substrate 310 so as to increase the surface area of the substrate 310 for the growth of the semiconductor layer. In this case, the semiconductor material can be grown on the bottom surface inside the protrusion 312, thereby resulting in the increased surface area of the substrate 310 on which the semiconductor layer grows.

When the protrusion 312 is formed on the substrate 310 by etching, as shown in FIG. 4A, the recess 314 is formed in the protrusion 312, wherein the surface of the substrate 310 exposed through the recess 314 is planar and has the directional property of the C plane. That is, the planar bottom surface in the protrusion 312 enables the semiconductor material to grow planarly on the surface of the substrate 310 in the protrusion 312. As a result, it is possible to improve quality of the semiconductor layer grown on the surface 310.

In this case, the depth (a) of the recess 314 inside the protrusion 312 may be the same as the height (b) of the protrusion 312, as shown in FIG. 4A. As shown in FIG. 4B, the depth (a) of the recess 314 may be larger than the height (b) of the protrusion 312.

As shown in FIG. 4C, the depth (a) of the recess 314 is smaller than the height (b) of the protrusion 312. In this case, the inner bottom surface of the protrusion 312 will be exposed through the recess 314. Preferably, the inner bottom surface of the protrusion 312 exposed through the recess 314 is planar and has the directional property of the C plane.

When forming the protrusion 312 according to the aforementioned embodiments of the present invention, the area of the protrusion 312 in a horizontally-sectioned view is gradually decreased from its bottom 316 to top 317, wherein the bottom of the protrusion 312 is in contact with the substrate 310. Meanwhile, the recess 314 of the protrusion 312 is formed in such a way that the area of the recess 314 in a horizontally-sectioned view is gradually increased from its bottom 318 to top 317, wherein the bottom of the recess 314 is positioned near to the upper surface of the substrate 310.

For example, the protrusion 312 may be formed in such a way that its one vertical cross section is a semicircle shape, as shown in FIG. 5A; or the protrusion 312 may be formed in such a way that its one vertical cross section is a polygonal shape such as triangle, as shown in FIG. 5B.

Figure 6C:
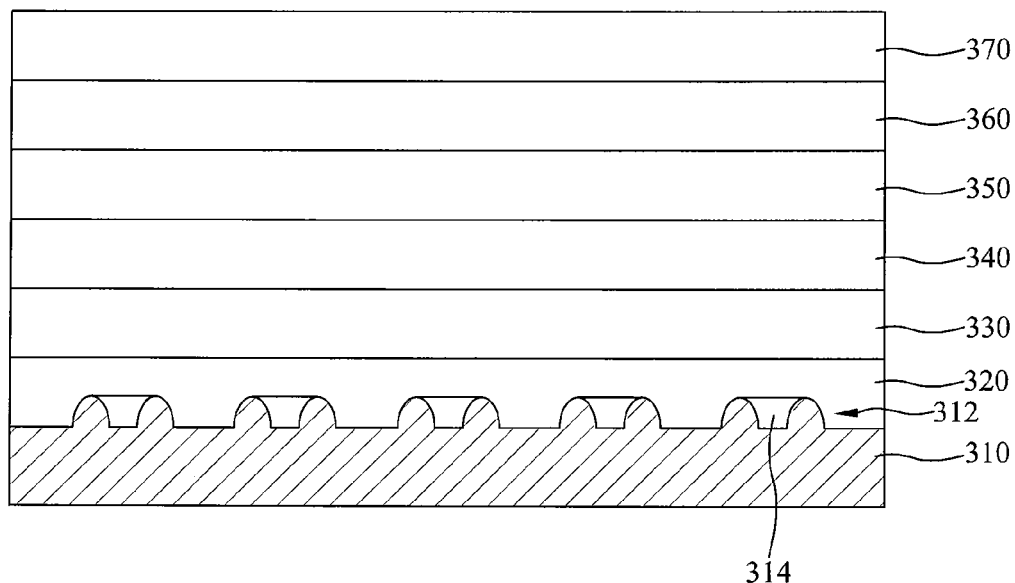

As shown in FIG. 6C, the buffer layer 320, the undoped semiconductor layer 330, the N-type nitride semiconductor layer 340, the active layer 350, the P-type nitride semiconductor layer 360, and the transparent electrode layer 370 are sequentially formed on the substrate 310 with the protrusions 312. At least any one of the buffer layer 320 and undoped semiconductor layer 330 may be formed; or neither the buffer layer 320 nor undoped semiconductor layer 330 may be formed.

Figure 6D:
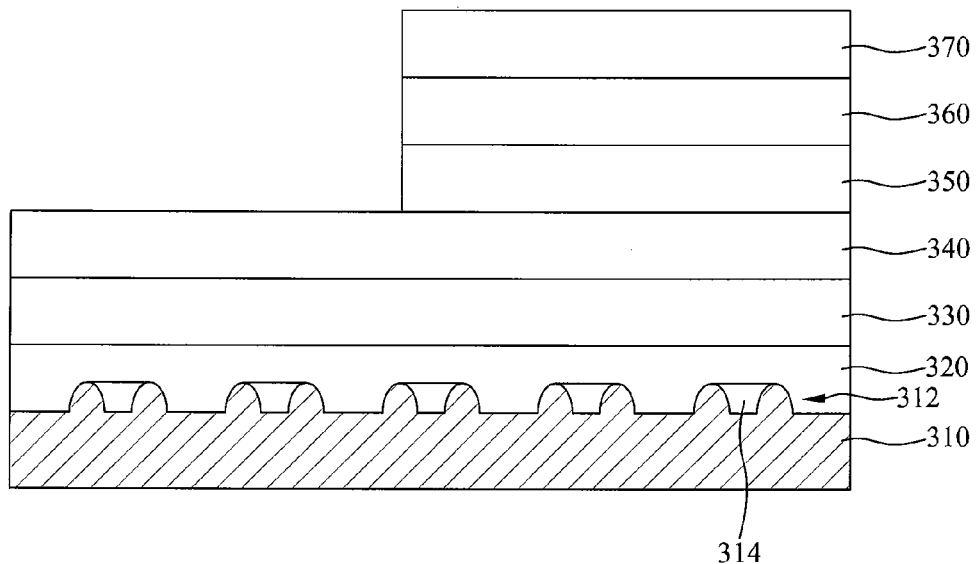

As shown in FIG. 6D, the mesa-etching is applied until the N-type nitride semiconductor layer 340 for formation of the N-type electrode 390.

Figure 6E:
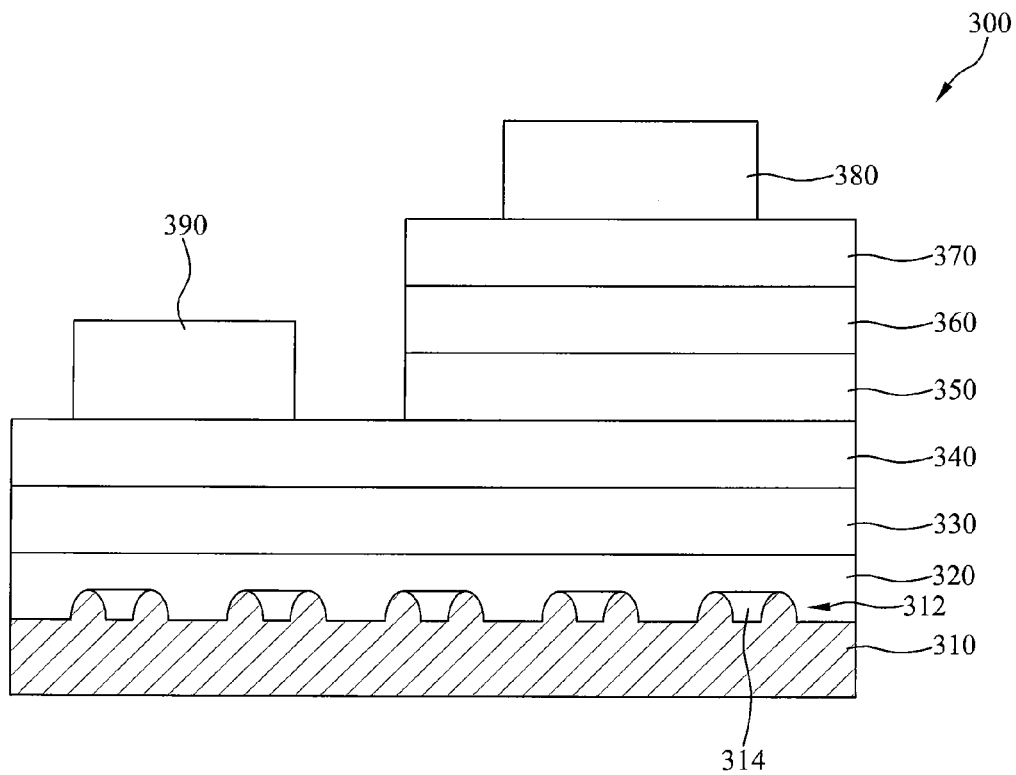

As shown in FIG. 6E, the P-type electrode 380 is formed on the transparent electrode layer 370, and the N-type electrode 390 is formed on the N-type nitride semiconductor layer 340.

For improving reliability of the semiconductor light-emitting device, although not shown, an insulating layer using an oxide such as $SiO_2$ is formed on the entire area of the semiconductor light-emitting device; the formed insulating layer is thinned by lapping and polishing processes; and then the semiconductor light-emitting device is divided into individual chips by a scribing process using laser or diamond.

FIG. 7 is a graph showing the improvement of internal quantum efficiency (IQE) in the semiconductor light-emitting device according to the first embodiment of the present invention by comparing IQE in a related art semiconductor light-emitting device with IQE in the semiconductor light-emitting device according to the first embodiment of the present invention.

Figure 7A:
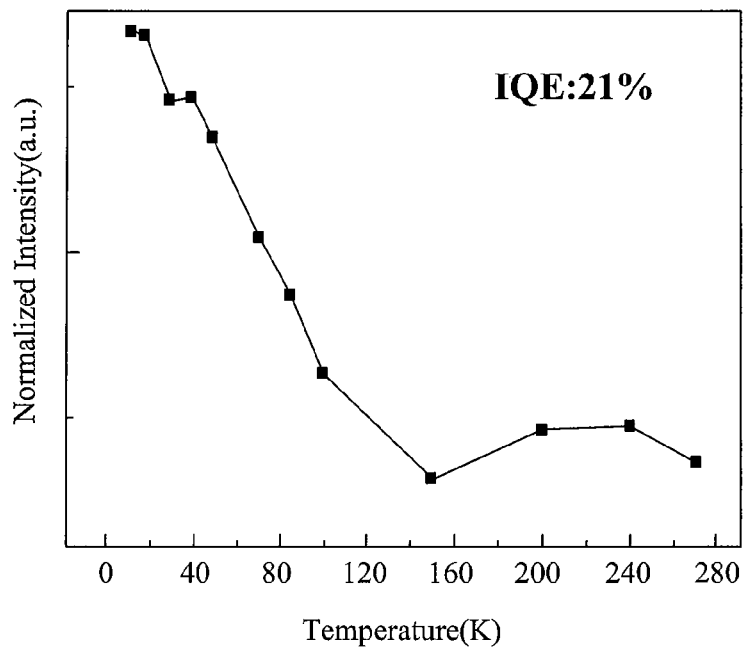
FIGS. 7A and 7B are a graph showing improvement of internal quantum efficiency (IQE) in a semiconductor light-emitting device according to the first embodiment of the present invention by comparing IQE in a related art semiconductor light-emitting device with IQE in the semiconductor light-emitting device according to the first embodiment of the present invention.
Figure 7B:
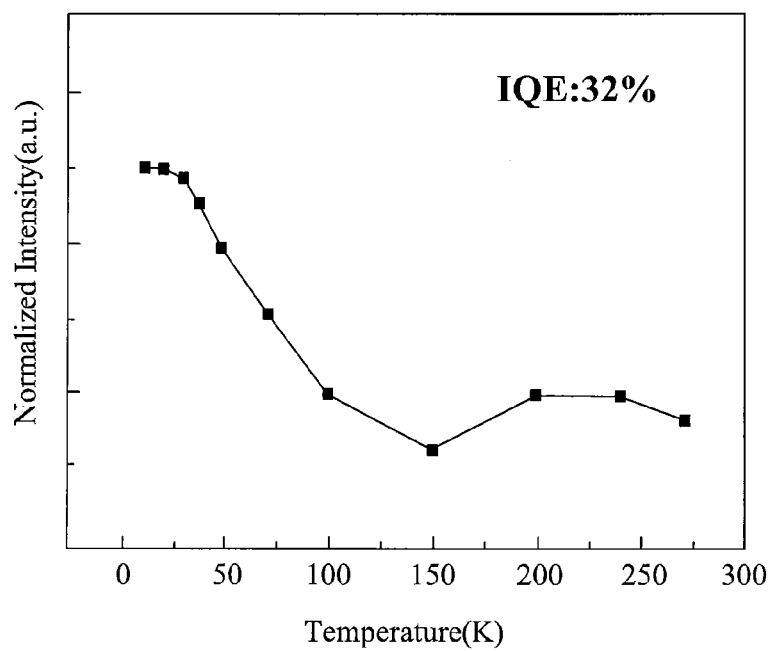

The related art semiconductor light-emitting device which is not provided with the protrusion shows only 21% IQE as shown in FIG. 7A. Meanwhile, the semiconductor light-emitting device according to the first embodiment of the present invention, which is provided with the protrusions 312 on the substrate 310, shows 32% IQE as shown in FIG. 7B. In comparison with the related art semiconductor light-emitting device, the semiconductor light-emitting device according to the first embodiment of the present invention enables 10% improvement in IQE.

FIG. 8 is a table showing the improvement of light extraction efficiency in the semiconductor light-emitting device according to the first embodiment of the present invention by comparing light extraction efficiency in a related art semiconductor light-emitting device with light extraction efficiency in the semiconductor light-emitting device according to the first embodiment of the present invention.

The related art semiconductor light-emitting device which is not provided with the protrusion shows only 26% light extraction efficiency, as shown in FIG. 8A. Meanwhile, the semiconductor light-emitting device according to the first embodiment of the present invention, which is provided with the protrusions 312 on the substrate 310, shows about 69% light extraction efficiency, as shown in FIG. 8B. In comparison with the related art semiconductor light-emitting device, the semiconductor light-emitting device according to the first embodiment of the present invention enables 40% improvement in light extraction efficiency.

Second Embodiment

The aforementioned semiconductor light-emitting device according to the first embodiment of the present invention discloses the protrusions only on the substrate. However, a semiconductor light-emitting device according to the second embodiment of the present invention discloses that protrusions are formed on a P-type nitride semiconductor layer in addition to a substrate, for improvement of light-transmitting efficiency. Hereinafter, the semiconductor light-emitting device according to the second embodiment of the present invention will be described with reference to FIG. 9.

Figure 9:
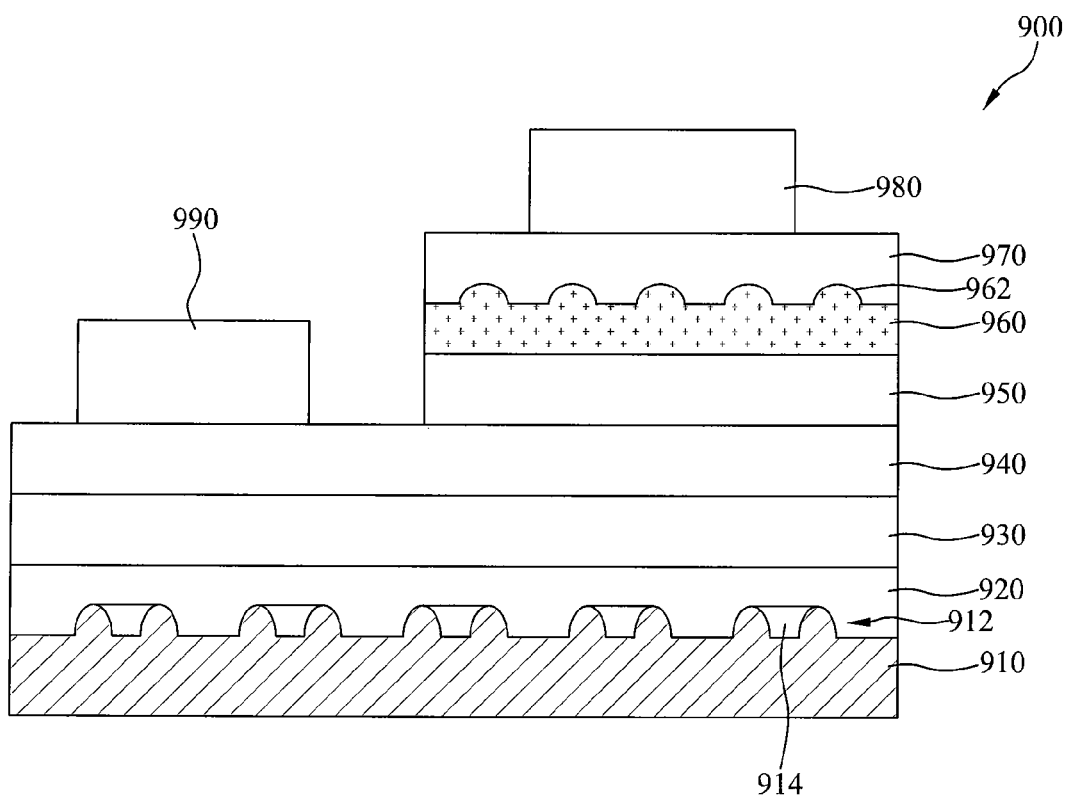
FIG. 9 is a cross section view illustrating a semiconductor light-emitting device according to the second embodiment of the present invention.

As shown in FIG. 9, the semiconductor light-emitting device according to the second embodiment of the present invention includes a substrate 910 on which one or more first protrusions 912 are formed, a buffer layer 920, an undoped semiconductor layer 930, an N-type nitride semiconductor layer 940, an active layer 950, a P-type nitride semiconductor layer 960 on which one or more second protrusions 962 are formed, a transparent electrode layer 970, a P-type electrode 980, and an N-type electrode 990.

In the same manner as the semiconductor light-emitting device according to the first embodiment of the present invention, the semiconductor light-emitting device according to the second embodiment of the present invention discloses that the buffer layer 920, the undoped semiconductor layer 930, the N-type nitride semiconductor layer 940, and the active layer 950 are sequentially formed on the substrate 910 with one or more first protrusions 912, wherein each first protrusion 912 is provided with a recess therein 914. That is, the first protrusion 912, substrate 910, buffer layer 920, undoped semiconductor layer 930, N-type nitride semiconductor layer 940, and active layer 950 provided in the semiconductor light-emitting device according to the second embodiment of the present invention are identical to those in the semiconductor light-emitting device according to the first embodiment of the present invention, whereby a detailed explanation for the first protrusion 912, substrate 910, buffer layer 920, undoped semiconductor layer 930, N-type nitride semiconductor layer 940, and active layer 950 provided in the semiconductor light-emitting device according to the second embodiment of the present invention will be omitted.

For realizing better light extraction efficiency, as shown in FIG. 9, one or more second protrusions 962 are formed on the P-type nitride semiconductor layer 960. At this time, the second protrusions 962 may be formed by etching the P-type nitride semiconductor layer 960.

According to one embodiment of the present invention, the second protrusion 962 is formed on the P-type nitride semiconductor layer 960. The second protrusion 962 is formed in such a way that its one vertical cross section is a semicircle shape, as shown in FIG. 9. This semicircle shape of the second protrusion 962 enables to increase light dispersion, thereby resulting in the improved light extraction efficiency.

According to another embodiment of the present invention, the second protrusion 962 may be identical in shape of one vertical cross section with the first protrusion 912. That is, a recess (not shown) may be formed in the second protrusion 962, so that the surface of the P-type nitride semiconductor layer 960 or the inner surface of the second protrusion 962 can be exposed through the recess of the second protrusion 962.

In more detail, a depth of the recess inside the second protrusion 962 may be the same as or larger than a height of the second protrusion 962, whereby the surface of the P-type nitride semiconductor layer 960 can be exposed through the recess of the second protrusion 962. Also, a depth of the recess inside the second protrusion 962 may be smaller than a height of the second protrusion 962, whereby the inner surface of the second protrusion 962 can be exposed through the recess of the second protrusion 962.

In this case, the surface of P-type nitride semiconductor layer 960 exposed through the recess or the inner surface of second protrusion 962 exposed through the recess is planer, preferably.

When forming the second protrusion 962, an area of the second protrusion 962 in a horizontally-sectioned view is gradually decreased from its bottom to top, wherein the bottom of the second protrusion is in contact with the P-type nitride semiconductor layer 960. Meanwhile, the recess inside the second protrusion 962 is formed in such a way that an area of the recess in a horizontally-sectioned view is gradually increased from its bottom to top, wherein the bottom of the recess is positioned near to the upper surface of the P-type nitride semiconductor layer 960.

In the same manner as the first protrusion 912, the second protrusion 962 may be formed in such a way that its one vertical cross section is a semicircle shape or polygonal shape such as triangle.

As shown in the aforementioned drawings, the second protrusion 962 is identical in height and pattern with the first protrusion 912. However, a modified embodiment of the present invention may disclose that the second protrusion 962 is different in height and pattern from the first protrusion 912.

Meanwhile, the transparent electrode layer 970, the P-type electrode 980, and the N-type electrode 990 are identical with the transparent electrode layer 370, the P-type electrode 380, and the N-type electrode 390 in FIG. 3, respectively. Thus, a detailed explanation for the transparent electrode layer 970, the P-type electrode 980, and the N-type electrode 990 will be omitted.

Hereinafter, a method for manufacturing the semiconductor light-emitting device according to the second embodiment of the present invention will be described with reference to FIG. 10. FIGS. 10A to 10G are cross section views illustrating a method for manufacturing the semiconductor light-emitting device according to the second embodiment of the present invention.

Figure 10A:
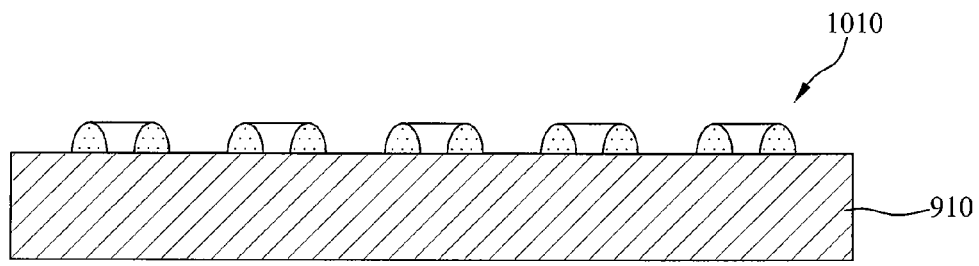
FIGS. 10A to 10G are cross section views illustrating a method for manufacturing a semiconductor light-emitting device according to the second embodiment of the present invention.
Figure 10B:
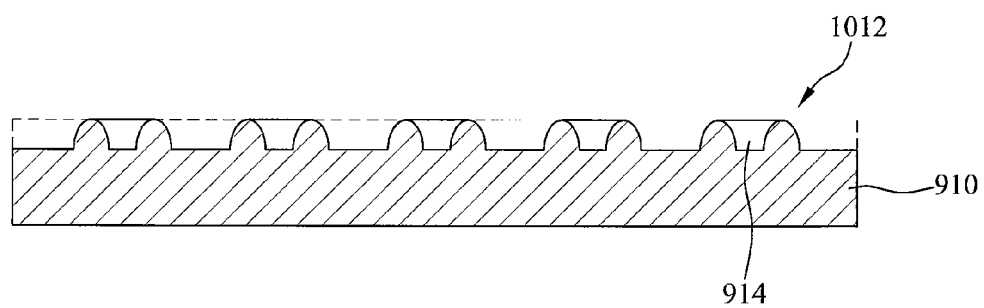

FIGS. 10A and 10B illustrates steps for forming one or more first protrusions 912 with the recess 914 on the substrate 910, which are identical with FIGS. 6A and 6B, whereby a detailed explanation for FIGS. 10A and 10B will be omitted.

Figure 10C:
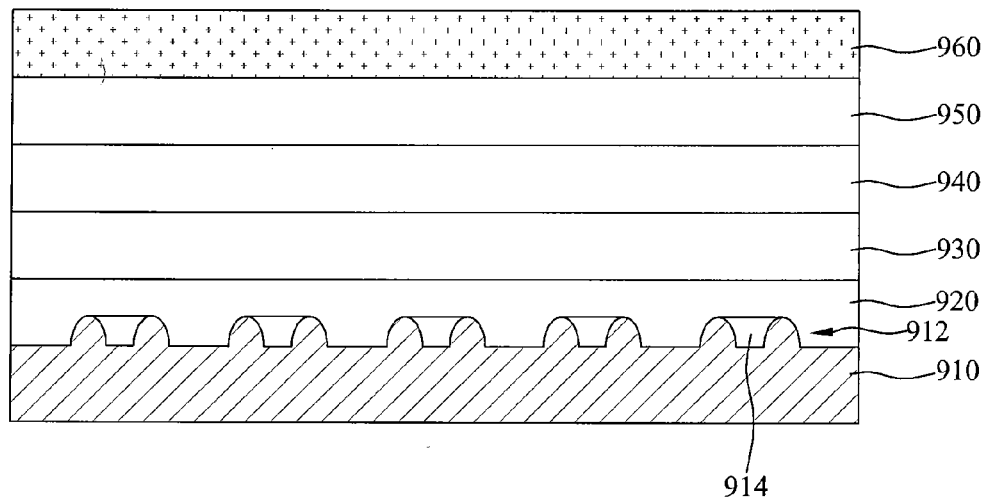

As shown in FIG. 10C, the buffer layer 920, the undoped semiconductor layer 930, the N-type nitride semiconductor layer 940, the active layer 950, and the P-type nitride semiconductor layer 960 are sequentially formed on the substrate 910 including the first protrusion 912. At least any one of the buffer layer 920 and the undoped semiconductor layer 930 may be formed; or neither the buffer layer 920 nor undoped semiconductor layer 930 may be formed.

Figure 10D:
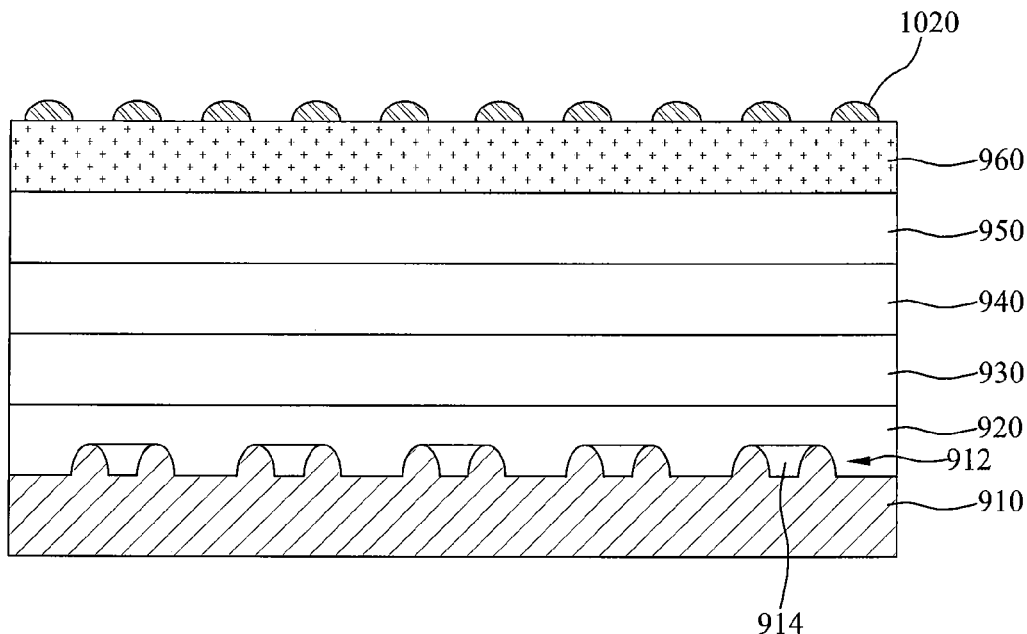

As shown in FIG. 10D, a mask pattern 1020 for forming the second protrusion 962 is formed on the P-type nitride semiconductor layer 960, wherein the mask pattern 1020 is formed through the use of photoresist, polymer, oxide layer ($SiO_2$), nitride layer ($SiN_x$), or metal thin film. A process for forming the mask pattern 1020 through the use of photoresist will be explained in brief After coating the P-type nitride semiconductor layer 960 with the photoresist, the photoresist is exposed and developed through the use of mask for forming the pattern, to thereby form the desired mask pattern 1020 on the P-type nitride semiconductor layer 960.

Figure 10E:
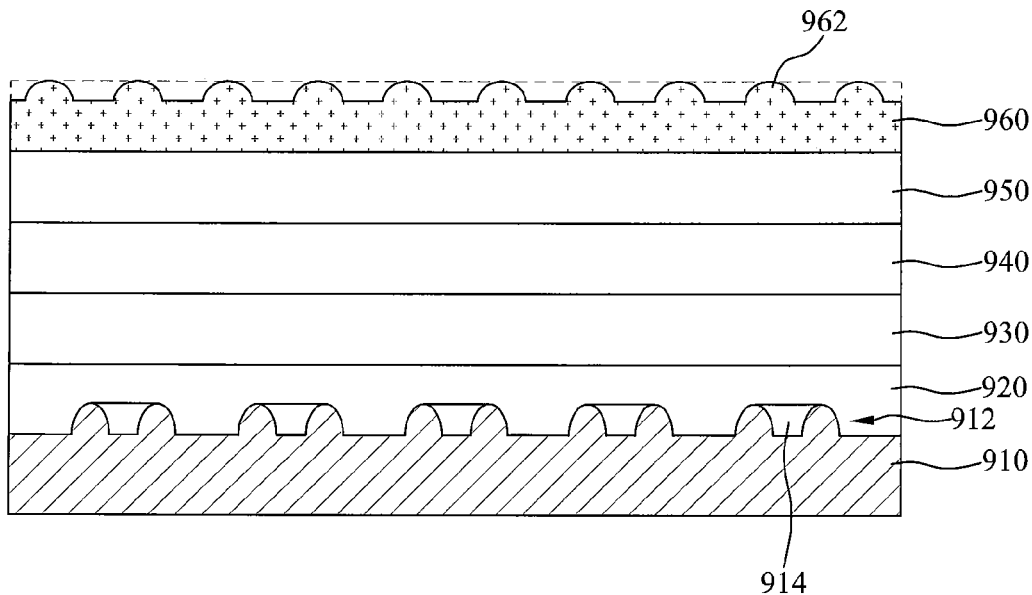

As shown in FIG. 10E, after etching the P-type nitride semiconductor layer 960 on which the mask pattern 1020 is formed, the mask pattern 1020 is removed from the P-type nitride semiconductor layer 960, thereby forming one or more second protrusions 962 on the P-type nitride semiconductor layer 960. In this case, the second protrusion 962 may be formed in such a way that its one vertical cross section is a semicircle shape, as shown in FIG. 9; or the second protrusion 962 may be formed in such a way that its one vertical cross section is identical with that of the first protrusion 912.

According to one embodiment of the present invention, the P-type nitride semiconductor layer 960 may be etched by wet etching or plasma etching. If applying the wet etching, the P-type nitride semiconductor layer 960 may be etched by using Cl-based gas selected from a group including $Cl_2$, $BCl_3$, HCl, and $CCl_4$, or by using an acid selected from a group including HBr, HF, HI, $H_2SO_4$, $NHO_3$, and $H_3PO_4$.

For realizing better light extraction efficiency, the second protrusion 962 is formed on the P-type nitride semiconductor layer 960.

Figure 10F:
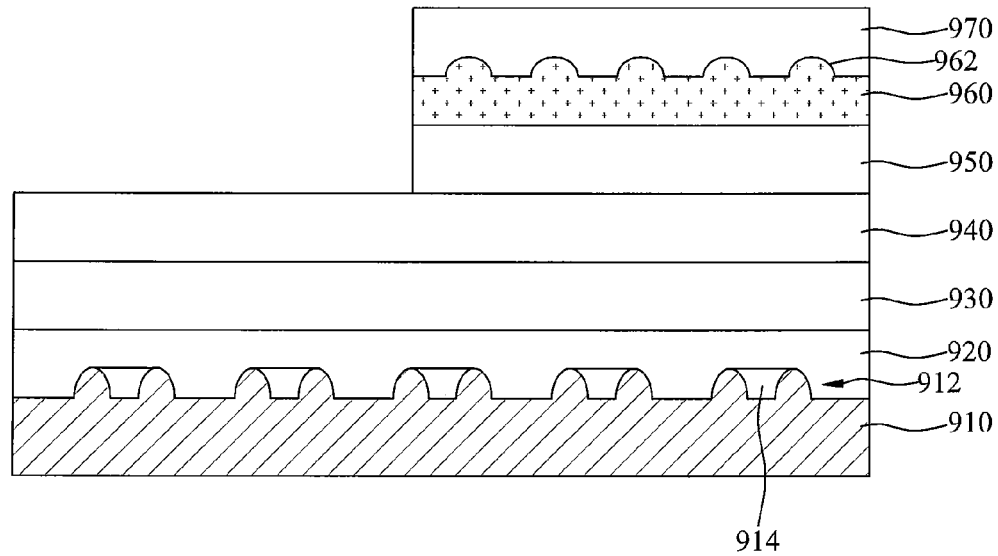

As shown in FIG. 10F, the transparent electrode layer 970 is formed on the P-type nitride semiconductor layer 960 including the second protrusion 962, and then the mesa-etching is applied until the N-type nitride semiconductor layer 940 for forming the N-type electrode 990.

Figure 10G:
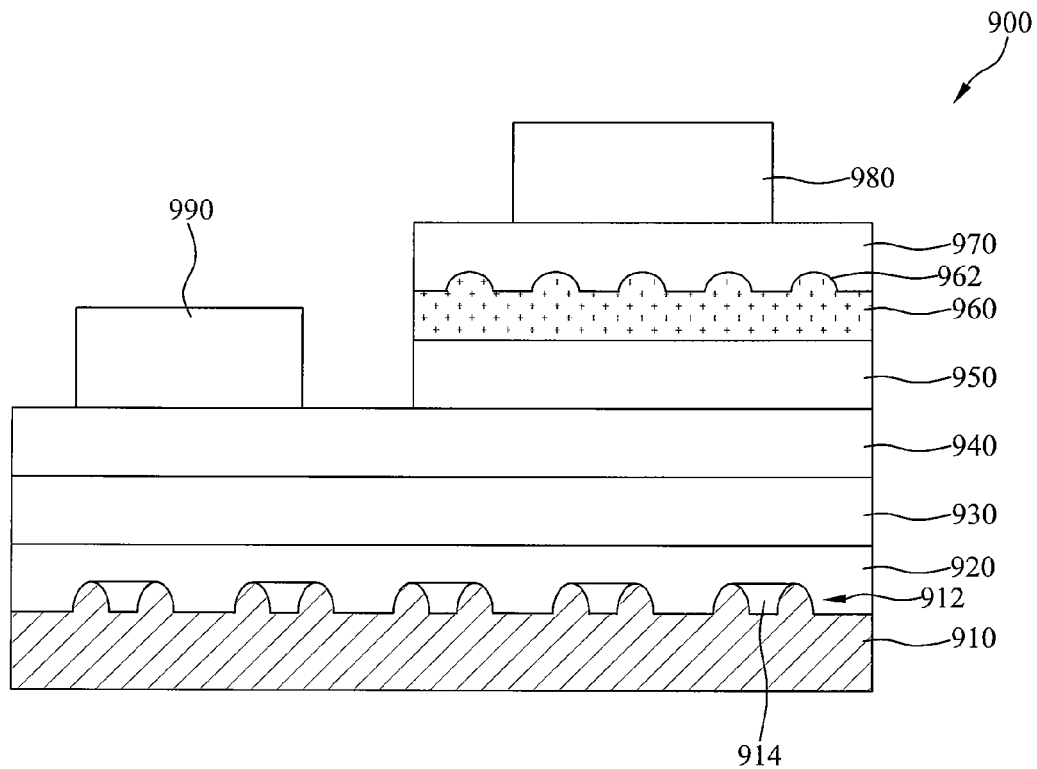

As shown in FIG. 10G, the P-type electrode 980 is formed on the transparent electrode layer 970, and the N-type electrode 990 is formed on the N-type nitride semiconductor layer 940.

Although not shown, in order to improve reliability of the semiconductor light-emitting device, an insulating layer using an oxide such as $SiO_2$ is formed on the entire area of the semiconductor light-emitting device; the formed insulating layer is thinned by lapping and polishing processes; and then the semiconductor light-emitting device is divided into individual chips by a scribing process using laser or diamond.

According to the present invention, one or more protrusions on the substrate enable to extract some of the transverse light, thereby resulting in the improved light extraction efficiency in the semiconductor light-emitting device according to the present invention.

Also, the recess formed inside the protrusion enables to planarly expose the surface of the substrate or the inner surface of the protrusion therethrough, so that it is possible to improve the quality of semiconductor layer grown on the substrate, and also to lower the dislocation density of the semiconductor layer.

Furthermore, IQE can be improved by the decrease of dislocation density in the semiconductor layer.

Also, the improved quality of the semiconductor light-emitting device enables to decrease a forward voltage and to increase a current dispersion.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

What is claimed is:

1. A semiconductor light-emitting device comprising:
    a substrate having an upper flat surface;
    one or more first protrusions on and elevated from the upper flat surface of the substrate, each first protrusion having a single recess through which a planar surface of the substrate is exposed planarly, the planar surface of the substrate being a planar bottom surface of the recess;
    a first semiconductor layer on the substrate including the one or more first protrusions;
    an active layer on the first semiconductor layer;
    a second semiconductor layer on the active layer;
    a first electrode on a predetermined portion of the first semiconductor layer,
    wherein the active layer and second semiconductor layer are not formed on the predetermined portion of the first semiconductor layer; and a second electrode on the second semiconductor layer,
    wherein the recess is formed inside the first protrusion, the planar bottom surface has a directional property of the c(0001) to enable a semiconductor material to grow planarly on the planar bottom surface,
    wherein the one or more first protrusions comprise a ring-shaped protrusion, the recess is inner space of the ring-shaped protrusion, and the semiconductor material is filled in the single recess included in the each first protrusion.

2. The semiconductor light-emitting device according to claim 1, wherein a depth of the recess is different from a height of the first protrusion.

3. The semiconductor light-emitting device according to claim 1, wherein the substrate is made of a material selected from the group consisting of a sapphire substrate, SiC substrate, or GaN substrate.

4. The semiconductor light-emitting device according to claim 1, wherein the first and second semiconductor layers are formed of at least one material among II/III-group compounds including GaN, AlN, or InN.

5. The semiconductor light-emitting device according to claim 1, wherein an area of the first protrusion in a horizontally-sectioned view is gradually decreased from its bottom to top, and wherein the bottom of the first protrusion is in contact with the substrate.

6. The semiconductor light-emitting device according to claim 1, wherein an area of the recess in a horizontally-sectioned view is gradually increased from its bottom to top, and wherein the bottom of the recess is positioned near to the upper surface of the substrate.

7. The semiconductor light-emitting device according to claim 1, wherein one vertical cross section of the first protrusion has a semicircle shape or polygonal shape.

8. A semiconductor light-emitting device comprising:
    a substrate having an upper flat surface;
    a first protrusion and elevated from the upper flat surface of on the substrate, the first protrusion having a single recess therein;
    a first semiconductor layer on the substrate including the first protrusion;
    an active layer on the first semiconductor layer;
    a second semiconductor layer on the active layer; a first electrode on a predetermined portion of the first semiconductor layer,
    wherein the active layer and second semiconductor layer are not formed on the predetermined portion of the first semiconductor layer; and a second electrode on the second semiconductor layer,
    wherein a depth of the recess is different from a height of the first protrusion so as to planarly expose an inner surface of the first protrusion through the recess,
    wherein the recess is formed inside the first protrusion and has a planar bottom surface having a directional property of the c(0001) to enable a semiconductor material to grow planarly on the planar bottom surface,
    wherein the first protrusion comprises a ring-shaped protrusion, the recess is inner space of the ring-shaped protrusion, and the semiconductor material is filled in the single recess included in the first protrusion.

9. The semiconductor light-emitting device according to claim 8, further comprising a second protrusion on the second semiconductor layer.

10. The semiconductor light-emitting device according to claim 9, wherein the second protrusion is identical in shape with the first protrusion, or the second protrusion has one side with a semicircle-shaped cross section.

11. A method for manufacturing a semiconductor light-emitting device comprising:
    forming one or more first protrusions on a substrate, each first protrusion having a single recess through which a surface of the substrate is exposed planarly;
    forming a first semiconductor layer on the substrate including the one or more first protrusions;
    forming an active layer on the first semiconductor layer;
    forming a second semiconductor layer on the active layer;
    etching predetermined portions of the active layer and second semiconductor layer until the first semiconductor layer is exposed; and
    forming a first electrode on a predetermined portion of the first semiconductor layer, wherein the active layer and second semiconductor layer are not formed on the predetermined portion of the first semiconductor layer, and forming a second electrode on the second semiconductor layer,
    wherein the single recess is formed inside the each first protrusion, and has a planar bottom surface having a directional property of the c(0001) to enable a semiconductor material to grow planarly on the planar bottom surface,
    wherein the one or more first protrusions comprise a ring-shaped protrusion, the recess is inner space of the ring-shaped protrusion, and the semiconductor material is filled in the single recess included in the each first protrusion.

12. The method according to claim 11, wherein forming the first protrusions comprises: forming a mask pattern for forming the first protrusions on the substrate through the use of photoresist, polymer, oxide layer, nitride layer, or metal thin film; and etching the substrate on which the mask pattern is formed.

13. The method according to claim 12, wherein etching the substrate comprises: applying a wet etching process or plasma etching process so as to etch the substrate.

14. The method according to claim 12, wherein etching the substrate comprises: applying the wet etching process by using Cl-based gas selected from a group including $Cl_2$, $BCl_3$, $HCl$, and $CCl_4$, or by using an acid selected from a group including HBr, HF, HI, $H_2SO_4$, $NHO_3$, and $H_3PO_4$.

15. The method according to claim 11, wherein forming the first protrusions comprises: forming the recess in such a way that a depth of the recess is different from a height of the first protrusion.

16. The method according to claim 11, wherein forming the first protrusion comprises: forming the first protrusion in such a way that its one vertical cross section is a semicircle shape or polygonal shape.

17. A method for manufacturing a semiconductor light-emitting device comprising:
    forming one or more first protrusions on a substrate, each first protrusion having a simile recess therein;
    forming a first semiconductor layer on the substrate including the one or more first protrusions;
    forming an active layer on the first semiconductor layer;
    forming a second semiconductor layer on the active layer;
    etching predetermined portions of the active layer and second semiconductor layer until the first semiconductor layer is exposed; and
    forming a first electrode on a predetermined portion of the first semiconductor layer, wherein the active layer and second semiconductor layer are not formed on the predetermined portion of the first semiconductor layer, and forming a second electrode on the second semiconductor layer,
    wherein an inner surface of the first protrusion is exposed through the recess by forming the first protrusion having the recess whose depth is different from a height of the first protrusion,
    wherein the single recess has a planar bottom surface having a directional property of the c(0001) to enable a semiconductor material to grow planarly on the planar bottom surface,
    wherein the one or more first protrusions comprise a ring-shaped protrusion, the recess is inner space of the ring-shaped protrusion, and the semiconductor material is filled in the single recess included in the first protrusion.

18. The method according to claim 11, further comprising forming a second protrusion on the second semiconductor layer between forming the second semiconductor layer and etching the predetermined portions of the active layer and second semiconductor layer, wherein the second protrusion is identical in shape with the first protrusion, or the second protrusion has one side with a semicircle-shaped cross section.

19. The method according to claim 18, wherein forming the second protrusion comprises: forming a mask pattern for forming the second protrusions on the second semiconductor layer through the use of photoresist, polymer, oxide layer, nitride layer, or metal thin film; and etching the second semiconductor layer on which the mask pattern is formed.

* * * * *

UNITED STATES PATENT AND TRADEMARK OFFICE
CERTIFICATE OF CORRECTION

PATENT NO. : 8,519,412 B2
APPLICATION NO. : 12/837274
DATED : August 27, 2013
INVENTOR(S) : Su Hyoung Son et al.

It is certified that error appears in the above-identified patent and that said Letters Patent is hereby corrected as shown below:

In the Claims

In column 13, claim 17, about line 31, after "protrusion having a" replace "simile" with --single--.

Signed and Sealed this
Third Day of December, 2013

Margaret A. Focarino
*Commissioner for Patents of the United States Patent and Trademark Office*